US012760445B2

(12) United States Patent
Iida et al.

(10) Patent No.: US 12,760,445 B2
(45) Date of Patent: Oct. 13, 2026

(54) NITROGEN-DOPED POLYCRYSTALLINE SiC FILM HAVING AN AVERAGE GRAIN SIZE OF 0.5 TO 5 .mu.M AND METHOD FOR PRODUCING THE SAME BY PERFORMING CVD ON A HEATED BASE MATERIAL

(71) Applicant: TOKAI CARBON CO., LTD., Tokyo (JP)

(72) Inventors: Takuji Iida, Tokyo (JP); Hiroyuki Jindo, Tokyo (JP); Shohei Oishi, Tokyo (JP); Ikuya Takahashi, Tokyo (JP); Yuji Ushijima, Tokyo (JP); Reiko Yashikida, Tokyo (JP)

(73) Assignee: TOKAI CARBON CO., LTD., Tokyo (JP)

( * ) Notice: Subject to any disclaimer, the term of this patent is extended or adjusted under 35 U.S.C. 154(b) by 268 days.

(21) Appl. No.: 18/285,224

(22) PCT Filed: Feb. 15, 2023

(86) PCT No.: PCT/JP2023/005209
§ 371 (c)(1),
(2) Date: Sep. 29, 2023

(87) PCT Pub. No.: WO2023/171270
PCT Pub. Date: Sep. 14, 2023

(65) Prior Publication Data

US 2024/0183071 A1 Jun. 6, 2024

(30) Foreign Application Priority Data

Mar. 7, 2022 (JP) ................................ 2022-034205

(51) Int. Cl.
*C30B 28/14* (2006.01)
*C30B 29/36* (2006.01)

(52) U.S. Cl.
CPC .............. *C30B 29/36* (2013.01); *C30B 28/14* (2013.01)

(58) Field of Classification Search
CPC ....... C30B 23/00; C30B 23/002; C30B 23/02; C30B 23/025; C30B 25/00; C30B 25/02;
(Continued)

(56) References Cited

U.S. PATENT DOCUMENTS

2002/0004444 A1 1/2002 Goela et al.
2002/0037801 A1 * 3/2002 Sugihara ............... C23C 16/325 427/249.15

(Continued)

FOREIGN PATENT DOCUMENTS

JP 2001316821 A 11/2001
JP 2002-047066 A 2/2002

(Continued)

OTHER PUBLICATIONS

Noh, et al. publication entitled "A study of electrical properties and microstructure of nitrogen-doped poly-SiC films deposited by LPCVD," Sensors and Actuators A, vol. 136, pp. 613-617 (2007). (Year: 2007).*

(Continued)

*Primary Examiner* — Kenneth A Bratland, Jr.
(74) *Attorney, Agent, or Firm* — Hoffmann & Baron, LLP

(57) ABSTRACT

The present invention addresses the problem of providing: a polycrystalline SiC molded article that has a small volume resistivity despite having a small crystal grain size; and a method for producing the same. The present invention provides a polycrystalline SiC molded body in which the average crystal grain size of 5 μm or less, a nitrogen concentration of $2.7\times10^{19}$ to $5.4\times10^{20}$ (pcs./cm$^3$), and the product of the carrier density×Hall mobility of $4.0\times10^{20}$ to $6.0\times10^{2}1$ (pcs./cmVsec).

6 Claims, 2 Drawing Sheets

(58) Field of Classification Search
CPC ....... C30B 25/14; C30B 25/16; C30B 25/165; C30B 29/00; C30B 29/10; C30B 29/36; C30B 28/00; C30B 28/12; C30B 28/14; C01B 32/956; C01B 32/963; C01B 32/977
USPC ..................... 117/84, 88, 101–102, 937, 951
See application file for complete search history.

(56) References Cited

U.S. PATENT DOCUMENTS

| | | | |
|---|---|---|---|
| 2003/0036471 | A1 | 2/2003 | Goela et al. |
| 2004/0229395 | A1 | 11/2004 | Goela et al. |
| 2022/0344452 | A1 | 10/2022 | Ushijima et al. |

FOREIGN PATENT DOCUMENTS

| | | | |
|---|---|---|---|
| JP | 4595153 | B2 * | 12/2010 |
| JP | 2020090421 | A | 6/2020 |
| WO | 2021060515 | A1 | 4/2021 |
| WO | 2021060518 | A1 | 4/2021 |

OTHER PUBLICATIONS

International Search Report for PCT/JP2023/005209, mailed Apr. 11, 2023.
Written Opinion of the International Searching Authority for PCT/JP2023/005209, mailed Apr. 11, 2023.
Office Action in Japanese Patent Application No. 2023-542562 mailed Sep. 5, 2023.

* cited by examiner

NITROGEN-DOPED POLYCRYSTALLINE SiC FILM HAVING AN AVERAGE GRAIN SIZE OF 0.5 TO 5 .mu.M AND METHOD FOR PRODUCING THE SAME BY PERFORMING CVD ON A HEATED BASE MATERIAL

CROSS-REFERENCE TO RELATED APPLICATIONS

This application is a national stage application under 35 USC § 371 of International Application No. PCT/JP2023/005209, filed Feb. 15, 2023, which claims the benefit of, and priority to Japanese Patent Application No. 2022-034205 filed Mar. 7, 2022, the disclosure of which are hereby expressly incorporated by reference into the present application in their entireties.

TECHNICAL FIELD

The present invention relates to a polycrystalline SiC molded body and a method for producing the same.

BACKGROUND ART

Polycrystalline SiC (silicon carbide) molded bodies are excellent in mechanical strength properties, electric properties, heat resistance, chemical stability, and the like, and are used in various industrial applications. For example, SiC molded bodies are used in a high-temperature atmosphere and a high-purity atmosphere. General applications include members for semiconductor manufacturing apparatuses such as dummy wafers and members included in semiconductor manufacturing apparatuses, and the like.

For example, polycrystalline SiC molded bodies as members for semiconductor manufacturing apparatuses are disk-shaped in general. Polycrystalline SiC molded bodies have a principal surface in the growth direction of a CVD film, and a front surface to a back surface except for a side surface are principal surfaces in the case of a disk-shaped molded body. The polycrystalline SiC molded bodies have a thickness that varies depending on a film-formation time, and can be formed in an arbitrary thickness. Polycrystalline SiC molded bodies having a diameter of a disk of around 100 to 300 mm are known.

In addition, as polycrystalline SiC molded bodies as members for semiconductor manufacturing apparatuses, cylindrical molded bodies obtained by forming a film on a bar-shaped base material are also favorably used. In this polycrystalline SiC molded body, the principal surface is in the growth direction of a CVD film, and in the case of a cylindrical molded body, a front surface to an inner surface of the cylinder are principal surfaces. The polycrystalline SiC molded bodies have a thickness that varies depending on a film-formation time, and can be formed in an arbitrary thickness. Polycrystalline SiC molded bodies having a diameter of a cylinder of around 5 to 700 mm are known.

Regarding a SiC molded body having a specific resistivity, Patent Literature 1 (Japanese Patent No. 4595153) describes a silicon carbide body for a semiconductor manufacturing member, obtained by a CVD method, wherein a content of a nitrogen element is 0.1 to 100 ppm, a content of metal elements other than silicon is 10 ppm or less, a specific resistance is 0.01 to 10 Ω·cm, and a variation in specific resistance is 10% or less. As a specific example thereof, silicon carbide bodies having a specific resistance of 0.1 to 5 Ω·cm are disclosed.

Patent Literature 2 (Japanese Patent Application Publication No 2001-316821) describes a free standing article comprising chemical vapor deposited, low-resistivity silicon carbide having an electrical resistivity of less than 0.9 Ω·cm, and as a specific example thereof, silicon carbide deposits having a resistivity of 0.25 to 0.9 Ω·cm are disclosed.

CITATION LIST

Patent Literatures

Patent Literature 1: Japanese Patent No. 4595153

Patent Literature 2: Japanese Patent Application Publication No 2001-316821

SUMMARY OF INVENTION

Meanwhile, there is a demand for polycrystalline SiC molded bodies having small crystal grain sizes as SiC molded bodies. A small crystal grain size is considered to be preferable because since general consumption preferentially proceeds from grain boundaries, a small crystal grain size leads to reduction of particles generated during the consumption. In addition, if the volume resistivity can be reduced in a polycrystalline SiC molded body, this is considered to be preferable for applications such as a heater, for example, among members for semiconductor manufacturing apparatuses.

However, in the case where the crystal grain size is small, a reduction in volume resistivity is limited because the mass free path of carriers decreases and the amount of present grain boundaries, which are conductivity resistance components, increases.

In view of this, an object of the present invention is to provide a polycrystalline SiC molded body having a small volume resistivity while having a small crystal grain size, and a method for producing the same.

As a result of conducting studies, the present inventors have found that the above-described object can be achieved by the following means.

[1]A polycrystalline SiC molded body having an average crystal grain size of 5 μm or less, a nitrogen concentration of $2.7\times10^{19}$ to $5.4>10^{20}$ (atoms/cm$^3$), and a product of carrier density×Hall mobility of $4.0>10^{20}$ to $6.0\times10^{21}$ (atoms/cmVsec).

[2] The polycrystalline SiC molded body according to [1], having a volume resistivity of 0.020 Ω·cm or less.

[3]A method for producing the polycrystalline SiC molded body according to [1] or [2], comprising the steps of placing a base material in a CVD reaction furnace; heating the base material; and forming a polycrystalline SiC film on the heated base material by a CVD method by introducing a mixed gas containing a raw material gas and a nitrogen-containing gas into the CVD reacting furnace, wherein the forming step is performed under such a condition that an arrival time r, which represents a time from when the mixed gas is introduced into the CVD reaction furnace to when the mixed gas reaches the base material, becomes 1.6 to 6.7 seconds.

[4] The production method according to [3], wherein the forming step is performed under such a condition that a film forming speed becomes 400 to 1300 μm/hr.

[5] The production method according to [3] or [4], wherein a reaction temperature of the base material is 1300 to 1400° C.

The present invention makes it possible to provide a polycrystalline SiC molded body having a small volume resistivity while having a small crystal grain size, and a method for producing the same.

DESCRIPTION OF EMBODIMENTS

1: Polycrystalline SiC Molded Body

Figure 1:
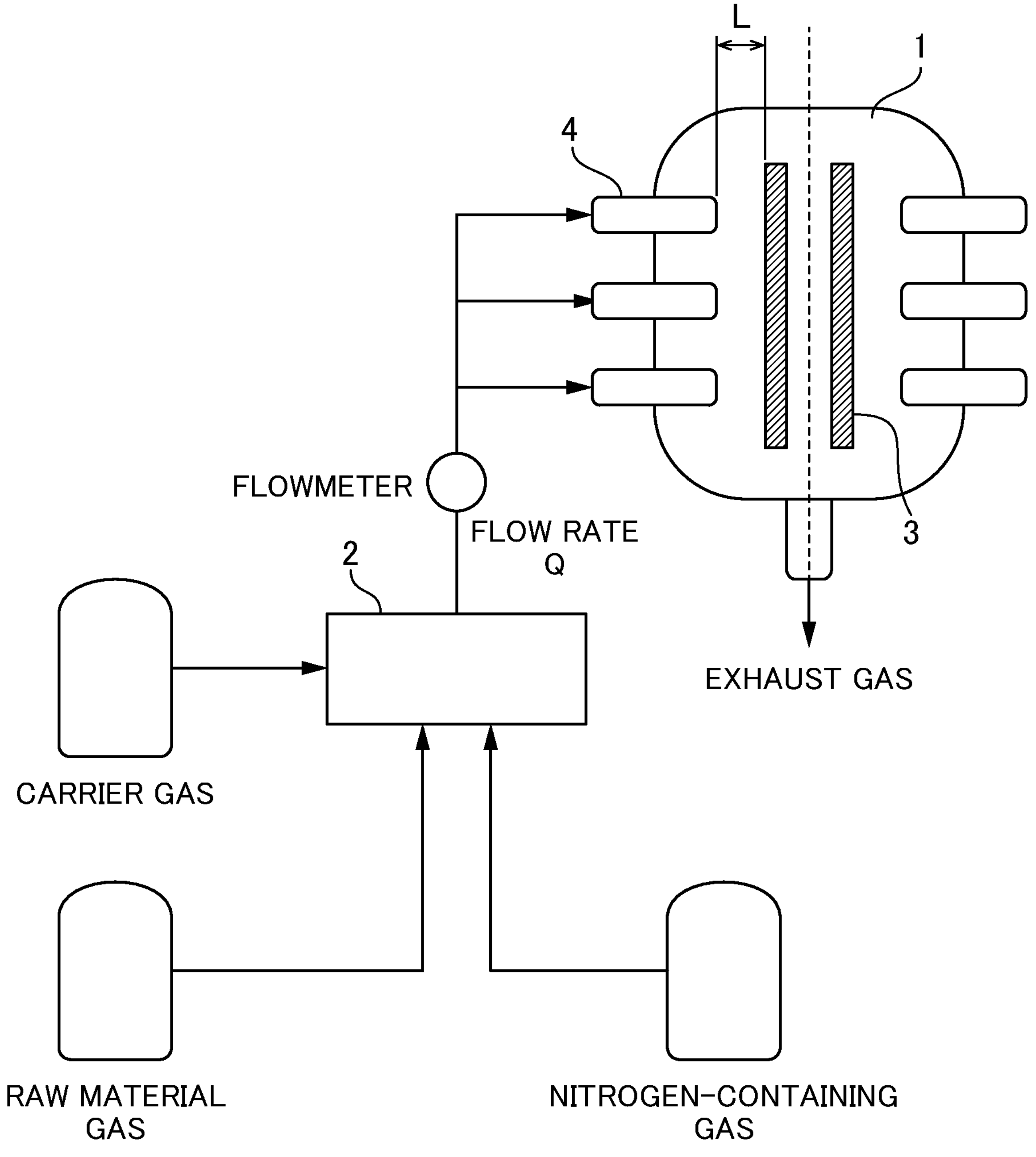
FIG. 1 is a schematic diagram showing an example of a system for producing a polycrystalline SiC molded body.

A polycrystalline SiC molded body according to an embodiment of the present invention has an average crystal grain size of 5 μm or less, a nitrogen concentration of $2.7\times10^{19}$ to $5.4\times10^{20}$ (atoms/$cm^3$), and a product of carrier density×Hall mobility of $4.0\times10^{20}$ to $6.0\times10^{21}$ (atoms/cmVsec). Employing such a configuration makes it possible to obtain a polycrystalline SiC molded body having a sufficiently small volume resistivity while having a small crystal grain size.

In the Specification, the "average crystal grain size" means a median grain size obtained by using EBSD (Electronbackscatter diffraction) (Area method).

A polycrystalline SiC molded body having an average crystal grain size of 5 μm or less can be said to be a polycrystalline SiC molded body having a small grain size. It is generally difficult to achieve a small volume resistivity for such a polycrystalline SiC molded body. However, the present embodiment makes it possible to obtain a sufficiently small volume resistivity in spite of an average crystal grain size of 5 μm or less.

The average crystal grain size is for example 0.5 to 5 μm, and preferably 1.0 to 5 μm.

In the Specification, the "nitrogen concentration" means the number of nitrogen atoms per unit volume (atoms/$cm^3$). The nitrogen concentration can be obtained by using dynamic SIMS (Secondary Ion Mass Spectrometry).

When the nitrogen concentration is within a range of $2.7\times10^{9}$ to $5.4\times10^{20}$ (atoms/$cm^3$), a sufficiently small volume resistivity can be obtained. Note that this nitrogen concentration corresponds to 200 to 3800 ppm.

Such a nitrogen concentration can be said to be a very large value as a concentration of impurities with which a polycrystalline SiC molded body is doped, and is such an amount as to normally exceed the solid solution limit. When nitrogen is added in such an amount as to exceed the solid solution limit, a compound different from SiC is generated, making it impossible to exert a function required as a polycrystalline SiC molded body. However, the present embodiment makes it possible to solid-dissolve nitrogen while the nitrogen is contained in such a concentration, and to thus satisfy properties required as a polycrystalline SiC molded body by a production method described later. Although the reason why such properties can be achieved is not clear, for example, it can be considered that since impurities are likely to accumulate in grain boundaries, a large amount of nitrogen can be contained without hindering the properties.

The "product of carrier density×Hall mobility" is a value obtained from a "carrier density (atoms/$cm^3$)" and a "Hall mobility (cm/Vsec)". The "product of carrier density×Hall mobility" is involved in a volume resistivity. The present embodiment makes it possible to obtain a sufficiently small volume resistivity because the "product of carrier density×Hall mobility" is $4.0\times10^{20}$ to $6.0\times10^{21}$ (atoms/cmVsec).

The "carrier density (atoms/$cm^3$)" means the concentration of impurities with which a SiC molded body is doped. The carrier density can be obtained by using a Hall effect measurement.

For example, the carrier density is $1.0\times10^{19}$ to $6.0\times10^{19}$ (atoms/$cm^3$).

The "Hall mobility ($cm^2$/Vsec)" is a known parameter and can be obtained by using a Hall effect measurement. For example, the Hall mobility is 10.0 to 150 ($cm^2$/Vsec).

The present embodiment makes it possible for a polycrystalline SiC molded body to have a volume resistivity of for example 0.020 Ω·cm or less, and preferably 0.010 Ω·cm or less. In addition, the polycrystalline SiC molded body can have a volume resistivity of more preferably 0.001 Ω·cm or less, and further preferably 0.0005 Ω·cm or less. The volume resistivity of the polycrystalline SiC molded body can be measured by using, for example, Loresta.

In one preferred aspect, the polycrystalline SIC molded body is 3C—SiC.

In one preferred aspect, the polycrystalline SIC molded body has a principal surface. The polycrystalline SIC molded body is preferably plate-shaped, and more preferably disk-shaped. In the case where the polycrystalline SIC molded body is plate-shaped, the principal surfaces of the polycrystalline SiC molded body mean a front surface and a back surface except for a side surface. In this case, the thickness of the polycrystalline SiC molded body is for example 0.1 to 5.0 mm, and preferably 0.2 to 3.0 mm. In addition, in the case where the polycrystalline SiC molded body is disk-shaped, the diameter of the polycrystalline SIC molded body is not particularly limited, but is for example 100 to 300 mm, and preferably 130 to 200 mm.

The polycrystalline SiC molded body may be cylindrical. When the polycrystalline SiC molded body is cylindrical, the principal surfaces of the polycrystalline SiC molded body mean a front surface and an inner surface of the cylinder.

In this case, the thickness of the polycrystalline SiC molded body is for example 0.1 to 5.0 mm, and preferably 0.2 to 3.0 mm.

In one more preferred aspect, the principal surface has a (111) peak intensity ratio of 0.6 or more. The "(111) peak intensity ratio" is a parameter representing a ratio of the diffraction peak intensity of the SiC (111) to a sum of the diffraction peak intensities of the SiC (111) plane, the SIC (200) plane, the SiC (220) plane, and the SiC (311) plane in an X-ray diffraction pattern. Note that in the case where the (111) peak intensity ratio varies in different positions in the principal surface, an average value is employed as the (111) peak intensity ratio.

That is, the polycrystalline SiC molded body is strongly oriented on (111). Having such a crystalline structure makes it possible to achieve a polycrystalline SiC molded body having a sufficiently small volume resistivity. Although the reason why such properties can be achieved is not clear, for example, it can be considered that since having a strongly oriented crystalline structure increases the mobility of carriers as compared with a randomly oriented structure, the volume resistivity is reduced.

2: Method for Producing a Polycrystalline SiC Molded Body

A polycrystalline SiC molded body having the above-mentioned properties can be obtained by adjusting film-formation conditions and the like in a production method described below. Hereinafter, the method for producing a polycrystalline SiC molded body according to the present embodiment will be described.

FIG. 1 is a schematic diagram showing an example of a manufacturing system used in the method for producing a polycrystalline SiC molded body according to the present embodiment. This manufacturing system is provided with a CVD reaction furnace 1 and a mixer 2. In the mixer 2, a carrier gas, a raw material gas serving as a supply source of SiC, and a nitrogen-containing gas are mixed to generate a mixed gas. The mixed gas is supplied from the mixer 2 to the CVD reaction furnace 1 at a flow rate Q. In the CVD reaction furnace 1, a base material 3 (for example, a graphite substrate) is placed. The CVD reaction furnace 1 is configured such that the base material 3 is heated during the operation. The base material 3 is preferably disk-shaped or bar-shaped. In addition, the CVD reaction furnace 1 is provided with nozzles 4, and the mixed gas is introduced into the CVD reaction furnace through these nozzles 4. When the mixed gas is introduced into the CVD reaction furnace, a polycrystalline SiC film is formed on the heated base material 3 by the CVD method. At this time, the polycrystalline SiC film is doped with nitrogen derived from the nitrogen-containing gas. That is, polycrystalline SiC film doped with nitrogen is obtained. From the polycrystalline SiC film thus obtained, the base material 3 is removed, and the polycrystalline SiC film is ground as necessary. In this way, polycrystalline SiC molded body is obtained.

In addition, in the example shown in FIG. 1, a plurality of the nozzles 4 are provided. In addition, the base material 3 is vertically placed. The plurality of nozzles 4 are provided on both sides of the furnace wall to sandwich the base material 3. In FIG. 1, "L" is a distance between each nozzle front end portion (the jetting port of the raw material gas) and the corresponding base material 3.

Figure 2:
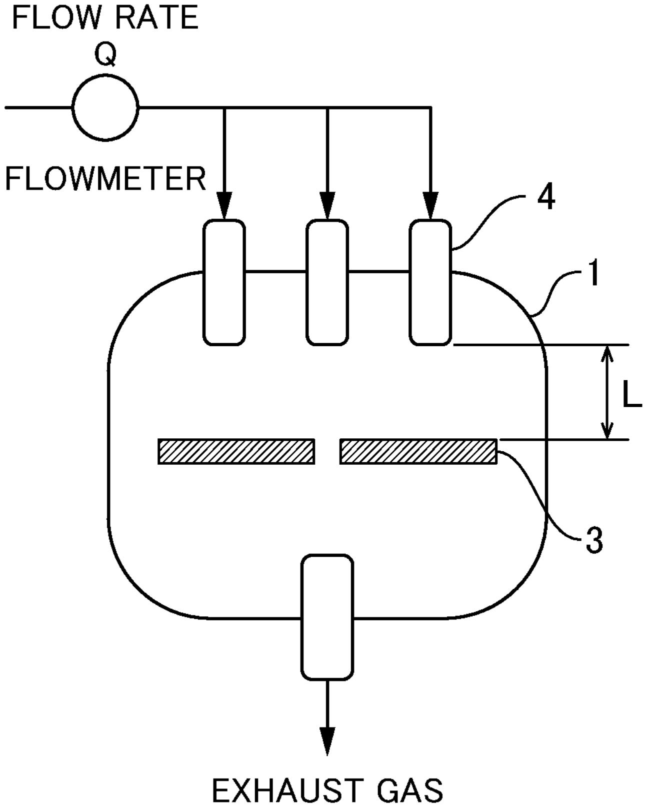
FIG. 2 is a schematic diagram showing Modification of a CVD reaction furnace.

Note that the CVD reaction furnace 1 does not necessarily have to have the configuration as described in FIG. 1. FIG. 2 is a diagram showing Modification of the CVD reaction furnace 1. In the example shown in FIG. 2, a plurality of nozzles 4 are provided in an upper portion of a CVD reaction furnace 1. A base material 3 is horizontally placed. The CVD reaction furnace 1 may have a configuration as described in FIG. 2.

The embodiment of the CVD reaction furnace may be a cold wall-type, a hot wall-type, or the like. In a CVD reaction furnace of cold wall-type, the furnace wall or the atmosphere in the furnace is not directly heated, and only a base material is directly heated. In addition, in a CVD reaction furnace of hot wall-type, the entire furnace including the furnace wall and the atmosphere in the furnace are heated. In the present embodiment, no difference is observed in the properties of obtained SiC molded bodies between the cold wall-type and the hot wall-type.

In addition, in the present embodiment, formation of the polycrystalline SiC film is performed in a specific arrival time $\tau$. Specifically, the formation is performed under such conditions that the arrival time $\tau$ becomes 1.6 to 6.7 seconds.

The "arrival time $\tau$" represents a time from when the mixed gas is introduced into the CVD reaction furnace to when the mixed gas reaches the base material. Specifically, the arrival time $\tau$ is obtained in accordance with the following Formula 1.

$$\text{The arrival time } \tau = L/u \qquad \text{(Formula 1)}$$

In Formula 1, "L" represents the distance between a raw material gas jetting port (a nozzle front end portion) and a base material as already mentioned.

"u" means the flow speed of the mixed gas in the reaction furnace.

"u" (the flow speed of the mixed gas) is obtained by "the flow rate (Q)/the sectional area of the jetting port (A)".

The flow rate "Q" represents the flow rate of the mixed gas between the mixer and the reaction furnace as explained in terms of FIG. 1. The flow rate (Q) is not particularly limited, but is for example 10 to 150 L/min, and preferably 20 to 110 L/min.

According to the finding of the present inventors, the arrival time $\tau$ affects the concentration of nitrogen to be solid-dissolved, and affects the carrier density and the Hall mobility. In view of this, by optimizing the arrival time $\tau$, it is possible to achieve a polycrystalline SiC film having a small volume resistivity while having a small crystal grain size. The arrival time $\tau$ is preferably set to 1.6 to 6.7 seconds, and is more preferable set to 1.8 to 5.7 seconds, and further preferably set to 2.0 to 5.0 seconds, from the viewpoint that the grain size can be adjusted to within a preferable range.

As the raw material gas, which serves as the supply source of SiC, a one component-based gas (gas containing Si and C) or a two component-based gas (gas containing Si and gas containing C) may be used. For example, one component-based raw material gases include methyltrichlorosilane, trichlorophenylsilane, dichloromethylsilane, dichlorodimethylsilane, chlorotrimethylsilane, and the like. In addition, two component-based raw material gases include mixtures of silane-containing gases such as trichlorosilane and monosilane and a hydrocarbon gas, and the like.

The nitrogen-containing gas only has to be capable of doping a polycrystalline SiC film with nitrogen. For example, a nitrogen gas is used as the nitrogen-containing gas.

The carrier gas used at the time of film formation is not particularly limited, but for example, a hydrogen gas or the like can be used.

The film-formation conditions other than the arrival time $\tau$ are not particularly limited, but for example, the following conditions can be employed.

Regarding the heating temperature at the time of film formation, the temperature of a base material is for example 1300 to 1400° C., and preferably 1300 to 1350° C. Note that the temperature of the furnace wall and heat insulating material in the furnace is preferably a temperature that does not cause decomposition products of SiC and the raw material gas to deposit (for example, 1000° C. or less, and preferably 700° C. or less).

The flow rate of the nitrogen-containing gas is for example 5 to 100 vol %, and preferably 30 to 50 vol % relative to a total flow rate of the flow rate of the nitrogen-containing gas, the flow rate of the raw material gas, and the flow rate of the carrier gas.

The film forming speed is for example 400 to 1300 μm/hr, and preferably 520 to 645 μm/hr.

The retention time is for example 5 to 40 seconds, and preferably 10 to 30 seconds. The retention time means a time during which the mixed gas is retained in the reaction furnace.

EXAMPLES

Hereinafter, the present invention will be more specifically described by using Examples. Note that the film-formation time in the present Examples and Comparative Examples was set to 1 to 5 hours, and the reaction temperature in Examples was set to 1300 to 1400° C. as appropriate.

In addition, the reaction temperature in Comparative Examples was set to 1200 to 1500° C. as appropriate.

Example 1

As a CVD reaction furnace, the CVD reaction furnace described in FIG. 1 was prepared. As a base material, one graphite substrate having a diameter of 160 mm and a thickness of 5 mm was prepared and placed in the CVD reaction furnace.

Subsequently, a polycrystalline SiC film was formed on the base material under the conditions described in Table 1. Specifically, MTS (methyltrichlorosilane) was used as the raw material gas. A $H_2$ gas was used as the carrier gas. A $N_2$ gas was used as the nitrogen-containing gas. The raw material gas, the carrier gas, and the nitrogen-containing gas were mixed in the mixer 2 to generate a mixed gas. The mixed gas was supplied into the CVD reaction furnace 1. The amount of the mixed gas supplied was set to a value described as "Gas amount" in Table 1. In addition, the concentrations of the MTS gas, the $H_2$ gas, and the $N_2$ gas in the mixed gas were as described in Table 1. The reaction temperature (base material temperature) was also set as described in Table 1.

The retention time was 13.4 seconds. The retention time was calculated in accordance with the following formula.

The retention time (seconds)=(the furnace inner volume (L)/the gas amount)×((20+273)/(the reaction temperature+273))×60 (Formula 2)

The base material arrival time τ was 3.14 seconds.

After the film formation, the graphite substrate was taken out of the CVD reaction furnace and was subjected to outer periphery processing and separation processing. Moreover, the graphite base material was removed to obtain a polycrystalline SiC molded body having a diameter of 150 mm and a thickness of 0.6 mm. Furthermore, a polycrystalline SiC molded body having a diameter of 150 mm and a thickness of 0.4 mm was obtained by a flat surface grinding process. This was obtained as a polycrystalline SiC molded body according to Example 1.

Examples 2 to 7 and Comparative Examples 1 to 3

Polycrystalline SiC films were formed in the same manner as in Example 1.

However, the film-formation conditions were changed as shown in Table 1.

(Evaluation Methods)

Regarding the polycrystalline SiC molded bodies thus obtained, the (111) peak intensity ratio, the carrier density, the Hall mobility, the nitrogen concentration (SIMS N concentration), the average crystal grain size, and the resistivity were obtained. The method for measuring each value is shown below.

(111) Peak Intensity Ratio

An X-ray diffraction pattern by the 2θ/θ method at the center of each polycrystalline SiC molded body was measured by using XRD-6000 manufactured by Shimadzu Corporation under the following conditions.

Cu target
Voltage: 40.0 kV
Current: 20.0 mA
Divergence slit: 1.00000 deg.
Scattering slit: 1.00000 deg.
Receiving slit: 0.30000 mm
Scan range: 20.000 to 80.000 deg.
Scan speed: 4.0000 deg./min.

Sampling pitch: 0.0200 deg.
Preset time: 0.30 sec.

In the X-ray diffraction pattern thus obtained, an average value of diffraction peak intensities within a range of diffraction angle 2θ of 20.0 to 80.0 deg. was used as a background correction value, and a diffraction peak intensity within a range of diffraction angle 2θ of 35.3 to 36.0 deg. was obtained as a peak intensity of the SiC (111) plane of 3C—SiC.

Similarly, a diffraction peak intensity within a range of diffraction angle 2θ of 41.1 to 41.8 deg. was obtained as a peak intensity of the SiC (200) plane.

Similarly, a diffraction peak intensity within a range of diffraction angle 2θ of 59.7 to 60.3 deg. was obtained as a peak intensity of the SiC (220) plane.

Similarly, a diffraction peak intensity within a range of diffraction angle 2θ of 71.5 to 72.3 deg. was obtained as a peak intensity of the SiC (311) plane.

Then, a total value of the diffraction peak intensities of the SiC (111) plane, the SiC (200) plane, the SiC (220) plane, and the SiC (311) plane was obtained. Furthermore, a ratio of the diffraction peak intensity of the SiC (111) to the total value was obtained as a (111) peak intensity ratio (X0).

(Carrier Density)

The resistivity by the Hall voltage and Van der Pauw was obtained by using Resitest 8200 manufactured by TOYO Corporation, and the carrier density and the Hall mobility were calculated (Hall effect measurement). The Hall effect measurement was performed under the following conditions with each sample being cut into a size of around 10 mm×10 mm×0.5 mm to form an In electrode.

Applied magnetic field: 1 T
Applied current: $1.0\times10^{-6}$ A
Measurement temperature: room temperature (295K)

(Nitrogen Concentration)

The content of nitrogen in the polycrystalline SiC molded body was measured by using SIMS-4000 manufactured by ATOMIKA.

(Average Crystal Grain Size)

An EBSD orientation map was measured in directions (hereinafter, referred to as an ND direction) of ±10° of the normal direction of the principal surface of the polycrystalline SiC molded body by using DigiView manufactured by TSL Solutions.

The measurement conditions for the EBSD orientation map were set as described below.

Pretreatment: mechanical polishing, carbon vapor deposition
Apparatus: FE-SEM, SU-70 manufactured by Hitachi High-Tech Corporation EBSD, DigiView manufactured by TSL Solutions
Measurement condition: voltage: 20 kV
Tilt angle: 70°
Measurement region: 100 μm×100 μm
Measurement interval: 0.03 μm
Evaluation target crystal system: 3C-type SiC (space group 216)

By using the above measured EBSD orientation map, a value obtained by multiplying the area of a single region in the entire region (100 μm×100 μm) by a value obtained by dividing the area of the single region by the total area of the observation region was obtained for all the single regions, and a total value of these values was calculated.

(Consideration of Results)

The results are shown in Table 2.

As shown in Table 1, the polycrystalline SiC molded bodies according to Examples 1 to 7 were formed under conditions in which the base material arrival time r was within the range of 1.6 to 6.7 seconds. As shown in Table 2, polycrystalline SiC molded bodies according to Examples 1 to 7 had low volume resistivities. Particularly, Examples 1 to 5 had very low volume resistivities (specifically, 0.011 Ω·cm or less). The average crystal grain sizes of the polycrystalline SiC molded bodies according to Examples 1 to 7 were 5 μm or less, and it was thus confirmed that these were polycrystalline SiC molded bodies having small crystal grain sizes. In addition, the nitrogen concentrations were $2.7\times10^{19}$ to $5.4\times10^{20}$ (atoms/cm$^3$). The products of carrier density×Hall mobility were $4.0\times10^{20}$ to $6.0\times10^{21}$ (atoms/cmVsec). The (111) peak intensity ratios were 0.6 or more.

On the other hand, in Comparative Example 1 in which the base material arrival time τ was 1.5 seconds, the volume resistivity was 0.022 Ω·cm, which was larger than those of Examples 1 to 7.

In addition, in Comparative Example 2 in which the base material arrival time was 0.03 seconds, the volume resistivity was 0.016 Ω·cm, which was also larger. In addition, the average crystal grain size was 11 μm, which was larger than those of Examples 1 to 7.

In addition, in Comparative Example 3 in which the base material arrival time was 7.0 seconds, the volume resistivity was 0.007 Ω·cm, but the average crystal grain size exceeded 5 μm.

TABLE 1

| Unit | Gas amount L/min. | MTS concentration % | $H_2$ concentration % | $N_2$ concentration % | Retention time sec. | Arrival time τ sec. |
|---|---|---|---|---|---|---|
| Example 1 | 41 | 14% | 42% | 44% | 13.4 | 3.14 |
| Example 2 | 27 | 14% | 42% | 44% | 20.4 | 4.78 |
| Example 3 | 41 | 14% | 42% | 44% | 13.5 | 3.14 |
| Example 4 | 27 | 14% | 42% | 44% | 20.4 | 6.63 |
| Example 5 | 41 | 14% | 42% | 44% | 13.3 | 4.00 |
| Example 6 | 107 | 15% | 48% | 37% | 5.0 | 1.63 |
| Example 7 | 107 | 15% | 48% | 37% | 5.0 | 1.63 |
| Comparative Example 1 | 41 | 14% | 42% | 44% | 13.5 | 1.50 |
| Comparative Example 2 | 340 | 4% | 52% | 44% | 21.8 | 0.03 |
| Comparative Example 3 | 41 | 14% | 42% | 44% | 13.5 | 7.00 |

REFERENCE SIGNS LIST

1 CVD reaction furnace
2 Mixer
3 Base material
4 Nozzle

What is claimed is:

1. A polycrystalline SiC film having
an average crystal grain size of 0.5 to 5 μm,
a nitrogen concentration of $2.7\times10^{19}$ to $5.4\times10^{20}$ (atoms/cm$^3$), and
a product of carrier density×Hall mobility of $4.0\times10^{20}$ to $6.0\times10^{21}$ (atoms/cmVsec).

2. The polycrystalline SiC film according to claim 1, having a volume resistivity of 0.020 Ω·cm or less.

3. A method for producing the polycrystalline SiC film according to claim 1, comprising the steps of:
placing a base material in a CVD reaction furnace;
heating the base material; and
forming a polycrystalline SiC film on the heated base material by a CVD method by introducing a mixed gas containing a raw material gas and a nitrogen-containing gas into the CVD reacting furnace,
wherein the forming step is performed under such a condition that an arrival time T, which represents a time from when the mixed gas is introduced into the CVD reaction furnace to when the mixed gas reaches the base material, becomes 1.6 to 6.7 seconds.

4. The production method according to claim 3, wherein the forming step is performed under such a condition that a film forming speed becomes 400 to 1300 μm/hr.

5. A method for producing the polycrystalline SiC film according to claim 2, comprising the steps of:
placing a base material in a CVD reaction furnace;
heating the base material; and
forming a polycrystalline SiC film on the heated base material by a CVD method by introducing a mixed gas containing a raw material gas and a nitrogen-containing gas into the CVD reacting furnace,
wherein the forming step is performed under such a condition that an arrival time τ, which represents a time from when the mixed gas is introduced into the CVD reaction furnace to when the mixed gas reaches the base material, becomes 1.6 to 6.7 seconds.

TABLE 2

| | (111) Peak intensity ratio | Carrier density (atoms/cm$^3$) | Hall mobility (cm$^2$/Vsec) | Carrier density × Hall mobility | Nitrogen concentration (atoms/cm$^3$) | Average crystal grain size (μm) | Resistivity (Ω · cm) average | Film forming speed (μm/hr) |
|---|---|---|---|---|---|---|---|---|
| Example 1 | 0.94 | 4.4E+19 | 77 | 3.4E+21 | 3.4E+20 | 3.0 | 0.008 | 639 |
| Example 2 | 0.93 | 5.0E+19 | 89 | 4.5E+21 | 4.0E+20 | 3.7 | 0.005 | 593 |
| Example 3 | 0.93 | 5.6E+19 | 101 | 5.7E+21 | 4.6E+20 | 3.7 | 0.002 | 560 |
| Example 4 | 0.91 | 2.5E+19 | 120 | 3.0E+21 | 4.7E+20 | 4.1 | 0.003 | 607 |
| Example 5 | 0.93 | 3.8E+19 | 65 | 2.5E+21 | 5.4E+20 | 3.0 | 0.011 | 641 |
| Example 6 | 0.89 | 1.8E+19 | 25 | 4.5E+20 | 8.0E+19 | 1.5 | 0.018 | 961 |
| Example 7 | 0.62 | 2.6E+19 | 41 | 1.1E+21 | 1.6E+20 | 1.0 | 0.015 | 1213 |
| Comparative Example 1 | 0.94 | 1.6E+19 | 21 | 3.4E+20 | 5.0E+20 | 4.0 | 0.022 | 650 |
| Comparative Example 2 | 0.28 | 2.2E+19 | 29 | 6.4E+20 | 7.9E+19 | 11.0 | 0.016 | 40 |
| Comparative Example 3 | 0.85 | 4.0E+19 | 130 | 5.2E+21 | 5.0E+20 | 5.5 | 0.007 | 450 |

6. The production method according to claim 5, wherein the forming step is performed under such a condition that a film forming speed becomes 400 to 1300 μm/hr.

* * * * *